(12) United States Patent
Fujimoto

(10) Patent No.: US 7,557,045 B2
(45) Date of Patent: Jul. 7, 2009

(54) MANUFACTURE OF SEMICONDUCTOR DEVICE WITH GOOD CONTACT HOLES

(75) Inventor: Shinji Fujimoto, Isa-gun (JP)

(73) Assignee: Yamaha Corporation, Shizuoka-Ken (JP)

( * ) Notice: Subject to any disclaimer, the term of this patent is extended or adjusted under 35 U.S.C. 154(b) by 25 days.

(21) Appl. No.: 11/373,999

(22) Filed: Mar. 14, 2006

(65) Prior Publication Data

US 2006/0211238 A1    Sep. 21, 2006

(30) Foreign Application Priority Data

Mar. 16, 2005    (JP)    ............................. 2005-074488

(51) Int. Cl.
*H01L 21/461*    (2006.01)
(52) U.S. Cl. ............................. 438/734; 257/E21.252; 257/E21.576; 257/E21.577
(58) Field of Classification Search ................. 438/734, 438/637; 257/E21.252, E21.576, E21.577
See application file for complete search history.

(56) References Cited

U.S. PATENT DOCUMENTS 5,843,847 A * 12/1998 Pu et al. ..................... 438/723

2002/0022361 A1 * 2/2002 Kim et al. ..................... 438/638
2006/0068592 A1 * 3/2006 Dostalik ........................ 438/706

FOREIGN PATENT DOCUMENTS

JP    2001-077086    3/2001

* cited by examiner

*Primary Examiner*—Asok K Sarkar
(74) *Attorney, Agent, or Firm*—Dickstein Shapiro LLP

(57) ABSTRACT

A wiring layer having an antireflection film of TiN or the like is formed on an insulating film covering a principal surface of a semiconductor substrate, and thereafter an interlayer insulating film including first to third insulating films is formed covering the wiring layer. The first and third insulating films are silicon oxide films formed by PE CVD or the like, and the second insulating film is a coated insulating film of inorganic or organic SOG. A contact hole is formed through the interlayer insulating film in a region corresponding to a partial surface area of the wiring layer, by dry etching using a resist layer as a mask. The coated insulating film, which is likely to be subjected to side etching, is etched under a highly depositive condition not containing $N_2$, and thereafter the lower insulating film is etched under a lowly depositive condition containing $N_2$.

6 Claims, 5 Drawing Sheets

MANUFACTURE OF SEMICONDUCTOR DEVICE WITH GOOD CONTACT HOLES

CROSS REFERENCE TO RELATED APPLICATION

This application is based on and claims priority of Japanese Patent Application No. 2005-074488 filed on Mar. 16, 2005, the entire contents of which are incorporated herein by reference.

BACKGROUND OF THE INVENTION

A) Field of the Invention

The present invention relates to a method for manufacturing a semiconductor device with contact holes such as LSIs, and more particularly to a method for manufacturing a semiconductor device with good contact holes through a laminated interlayer insulating film by selective dry etching.

B) Description of the Related Art

It is conventionally known that fluorocarbon-containing gas is used as etching gas in forming a contact hole through an interlayer insulating film by selective etching (for example, refer to JP-A-2001-77086).

SUMMARY OF THE INVENTION

An object of this invention is to provide a novel method for manufacturing a semiconductor device with contact holes capable of forming a contact hole providing good interlayer interconnect.

According to one aspect of the present invention, there is provided a method for manufacturing a semiconductor device comprising the steps of:

forming a wiring layer on an insulating film covering a principal surface of a substrate;

forming an interlayer insulating film on the insulating film, the interlayer insulating film covering the wiring layer and including a lamination film of a deposited insulating film and a coated insulating film stacked in a recited order from a bottom; and forming a contact hole through the interlayer insulating film in a region corresponding to a partial surface of the wiring layer, by a selective dry etching process, the selective dry etching process being executed by a plurality of steps including at least first and second steps, the first step etching the interlayer insulating film to a lower surface of the coated insulating film under a highly depositive condition, and the second step etching the deposited insulating film under a lowly depositive condition.

According to this method, the selective dry etching process of forming a contact hole through the interlayer insulating film is executed by a plurality of steps including at least first and second steps. Since the first step etches the interlayer insulating film down to the lower surface of the coated insulating film under the highly depositive condition, it is possible to suppress the side wall of the contact hole from being retracted by side-etch (having a bowing shape). Further, since the deposited insulating film is left in the first step, conductive material of the wiring layer is not etched and polymer generation can be suppressed. Furthermore, since the second step etches the deposited insulating film under the lowly depositive condition, polymer adhesion can be suppressed. The contact hole can therefore be formed which has a good shape and no polymer adhesion.

In this method, the selective dry etching process may execute etching of the second step after etching of the first step, without exposing the interlayer insulating film to an atmospheric air. In this case, a rapid process is possible while contamination is prevented. In this method, etching of the first step may use fluorocarbon gas not containing nitrogen, and etching of the second step may use fluorocarbon gas containing nitrogen. In this case, the etching condition can be changed easily only by changing a supply of $N_2$ gas from an off-state to an on-state. If the fluorocarbon gas is used as etching gas, it is preferable that the step of forming the wiring layer forms a wiring layer having a conductive layer containing titanium-containing compound as an uppermost layer. It is also preferable that the step of forming the interlayer insulating film forms an inorganic spin-on-glass film or an organic spin-on-glass film as the coated insulating film.

According to this method, since a contact hole having a good shape and no polymer adhesion can be formed, stability and reliability of an interlayer interconnect portion can be improved and reduction in a contact resistance can be achieved, at a low cost.

DESCRIPTION OF THE PREFERRED EMBODIMENTS

Prior to the description of embodiments, analysis of conventional techniques made by the present inventor will be described.

Figure 6:
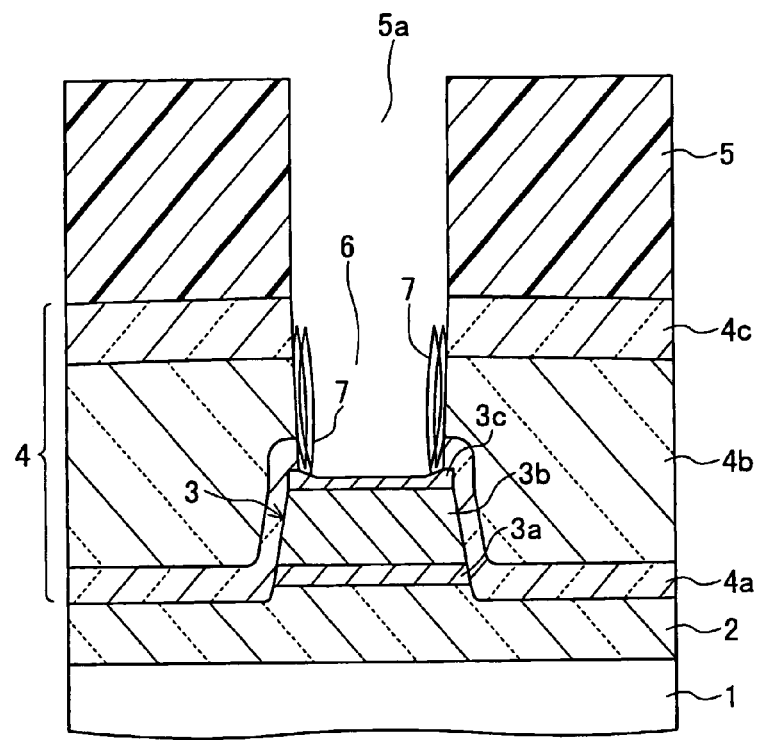
FIG. 6 is a cross sectional view illustrating a dry etching process in an example of a contact hole forming process made through researches by the present inventor.
Figure 7:
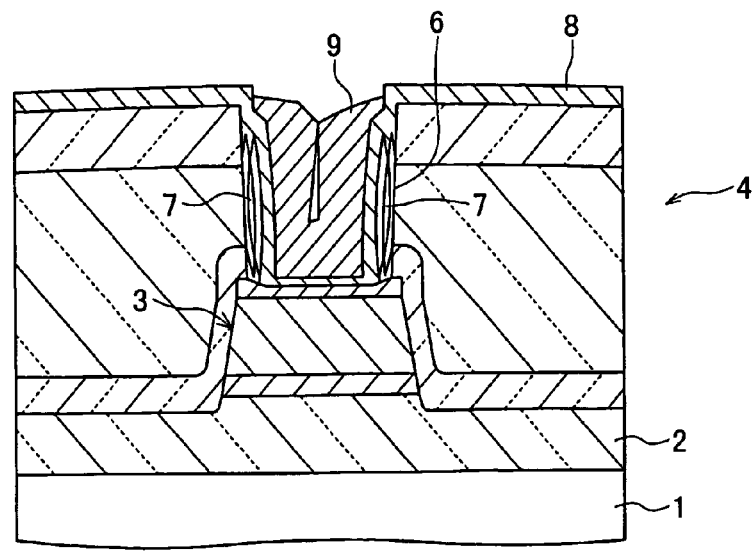
FIG. 7 is a cross sectional view illustrating a W plug forming process following the process shown in FIG. 6.
Figure 8:
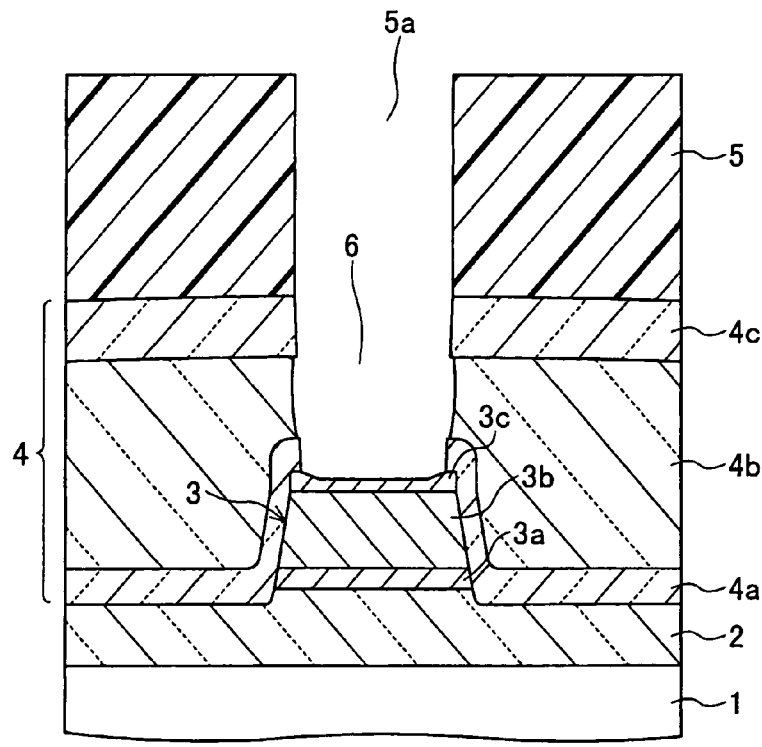
FIG. 8 is a cross sectional view illustrating a dry etching process in another example of a contact hole forming process made through researches by the present inventor.
Figure 9:
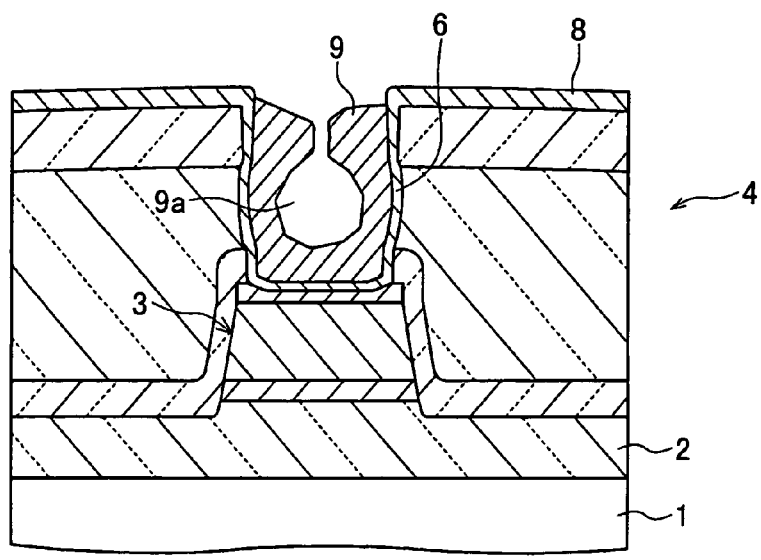
FIG. 9 is a cross sectional view illustrating a W plug forming process following the process shown in FIG. 8.

FIGS. 6 and 7 illustrate an example of a contact plug forming process made through researches by the present inventor, and FIGS. 8 and 9 illustrate another example.

In a process shown in FIG. 6, a lower wiring layer 3 is formed on an insulating film 2 such as a silicon oxide film covering a principal surface of a silicon substrate 1. The wiring layer 3 is formed of a lamination, constituted of a barrier metal layer 3a of TiN or the like, a wiring metal layer 3b of Al alloy or the like and an antireflection film 3c of TiN, TiON or the like stacked in this order from the bottom.

Next, an interlayer insulating film 4 is formed on the insulating film 2, covering the wiring layer 3. The interlayer insulating film 4 is formed of a lamination, constituted of a silicon oxide film 4a, a coated insulating film 4b and a silicon oxide film 4c stacked in this order from the bottom. Both the silicon oxide films 4a and 4c are formed by plasma enhanced chemical vapor deposition (PE CVD). The coated insulating film 4b is formed of a silicon oxide film, for example made by spin-coating hydroxy-silsesquioxane (HSQ) to form a flat surface coated film and thereafter subjecting the coated film to heat treatment.

A resist layer 5 is formed on the interlayer insulating film 4 by photolithography, having an aperture 5a in a region corresponding to a partial surface area of the wiring layer 3. A contact hole 6 is formed through the interlayer insulating film 4 in a region corresponding to the partial surface area of the wiring layer 3, by dry etching using the resist layer 5 as a mask. During this dry etching, mixture gas of $CF_4/CHF_3$ not added with $N_2$ (nitrogen) is used as etching gas.

In a process shown in FIG. 7, the resist layer 5 is removed by well-known ashing or the like. An adhesion layer 8 of TiN or the like is formed on the interlayer insulating film 4 by sputtering, covering the inner surface of the contact hole 6. After a W (tungsten) layer is deposited on the substrate upper surface, the W layer is etched back to form a W plug 9 made of W left in the contact hole 6. Thereafter, a wiring metal layer is deposited on the substrate upper surface, and an upper wiring layer connected with the adhesion layer 8 and W plug 9 is formed by patterning the wiring metal layer.

The contact plug forming process shown in FIGS. 8 and 9 is similar to the contact plug forming process described with reference to FIGS. 6 and 7, excepting that $N_2$ is added to etching gas (mixture gas of $CF_4CHF_3$) used in the dry etching process of forming the contact hole 6. In FIGS. 8 and 9, similar elements to those shown in FIGS. 6 and 7 are represented by similar reference symbols, and the detailed description thereof is omitted.

According to the contact plug forming process described with reference to FIGS. 6 and 7, the dry etching process shown in FIG. 6 is executed under a highly depositive condition wherein etching byproducts (polymer) 7 containing substances such as Ti, $TiN_x$ and $TiO_x$ derived from the antireflection film 3c are deposited and adhered strongly to the side wall of the contact hole 6. Therefore, as the adhesion layer 8 is formed by the process of FIG. 7, adhesion of the adhesion layer 9 to the side wall of the contact hole 6 becomes insufficient and a contact area of the adhesion layer with the wiring layer 3 reduces. Further, as the W plug 9 is formed, its buried shape is not good. There arises therefore an instable connection state and an increase in a contact resistance.

According to the contact plug forming process described with reference to FIGS. 8 and 9, the dry etching process shown in FIG. 8 is executed under a lowly depositive condition wherein less deposition of the reaction byproduct occurs on the side wall of the contact hole. Although deposition of the above-described polymer can be suppressed, the coated insulating film 4b is retracted by side etching and the contact hole 6 has a so-called bowing shape. Therefore, as the adhesion layer 8 is formed in the process shown in FIG. 9, the adhesion layer 8 has insufficient coverage or insufficient thickness on the side wall of the contact hole 6. Further, as the W plug 9 is formed, its buried shape is degraded because a void 9a is often formed in the central region. There arises therefore a degraded reliability and an increase in a contact resistance.

FIGS. 1 to 5 illustrate a method of manufacturing a semiconductor device including contact plug formation according to an embodiment of the present invention. Processes (1) to (5) corresponding to FIGS. 1 to 5 will be described sequentially.

(1) Semiconductor elements such as MOS transistors and the like are formed in a silicon substrate. First, an insulating film (field oxide film) Fox is selectively formed on a principal surface of a silicon substrate 10, defining active regions AR. Insulated gate structures G comprising a gate oxide film, a polysilicon gate electrode, and a silicide layer is formed traversing each active region AR. Source/drain regions S/D are formed by ion implantations of impurities before and after the formation of insulating side wall spacers SW. The insulated gate structures G are covered with an underlayer insulating layer UIL made, for example of silicon oxide by CVD. The underlayer insulating layer UIL may alternatively be formed of a lamination of a silicon nitride layer and a silicon oxide layer. The surface of the underlayer insulating layer UIL may preferably be planarized. Contact holes are made through the underlayer insulating layer UIL to expose contact areas of the transistors. Conductive plugs PL made for example of a lamination of Ti layer, TiN layer, and W layer are formed, burying the contact holes. Unnecessary portions of the conductive films on the underlayer insulating layer UIL is removed by etch-back or chemical mechanical polishing (CMP). A first (lower) metal wiring will be formed on the underlayer insulating layer UIL, being connected to the conductive plugs PL. Hereinafter, the underlayer insulating layer UIL and the field oxide layer Fox are collectively referred to as an insulating film 12.

(2) A lower wiring layer 14 is formed on an insulating film 12 such as a silicon oxide film covering a principal surface of a substrate 10 made of, e.g., silicon. The wiring layer 14 is formed of a lamination layer, constituted of a barrier metal layer 14a, a wiring metal layer 14b and an antireflection film 14c stacked in this order from the bottom. For example, the barrier metal layer 14a for diffusion suppression is formed by stacking a barrier film of TiN or the like on a resistance reducing film of Ti or the like. The antireflection film (cap metal film) 14c is made of a film of TiN or TiON, and if necessary, a Ti film may be formed under the antireflection film 14c. The material of the antireflection film 14c may be a compound of group IVa or V transition metal, particularly nitride, oxynitride, boridenitride, and preferably titanium-containing compound such as TiN, TiON and TiBN. These titanium-containing compounds are easily of high purity, and are inexpensive. Materials having a large atomic weight such as Hf and Ta are used recently and have high barrier performance.

Next, an interlayer insulating film 16 is formed on the insulating film 12, covering the wiring layer 14. The interlayer insulating film 16 is formed of a lamination layer, constituted of a deposited insulating film 16a, a coated insulating film 4b (low dielectric constant film) 16b and a deposited insulating film 16c stacked in this order from the bottom. The deposited insulating film 16a is formed so that the coated insulated film 16b does not contact directly the wiring layer 14 and the etching conditions can be changed during two-step etching. The deposited insulating film 16a has the characteristics that the deposited insulating film 16a is hard to be side-etched even if it is etched under a lowly depositive condition relative to the coated insulating film 16b. The deposited insulating film 16c is formed when necessary.

As both the deposited insulating films 16a and 16c, silicon oxide films are formed by PE CVD using tetraethoxysilane (TEOS) as source material. A low dielectric constant inorganic spin-on-glass (SOG) film or a low dielectric constant organic SOG film may be formed as the coated insulating film 16b. A silicon oxide film may be formed as the coated insulating film 16b, by spin-coating HSQ resin to form a flat surface coated film and thereafter subjecting the coated film to heat treatment. The HSQ resin may be organic HSQ resin such as methyl-silsesquioxane (MHSQ).

After the interlayer insulating film 16 is formed, a resist layer 18 is formed on the interlayer insulating film 16 by photolithography, having an aperture 18a in a region corresponding to a partial surface area of the wiring layer 14.

Figure 1:
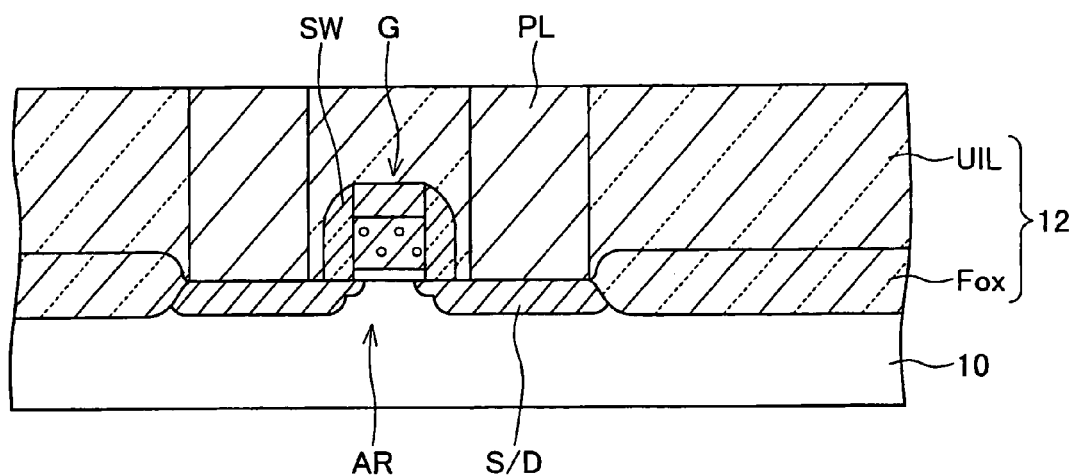
FIG. 1 is a cross sectional view illustrating a transistor forming process in the method of manufacturing a semiconductor device according to an embodiment of this invention.
Figure 2:
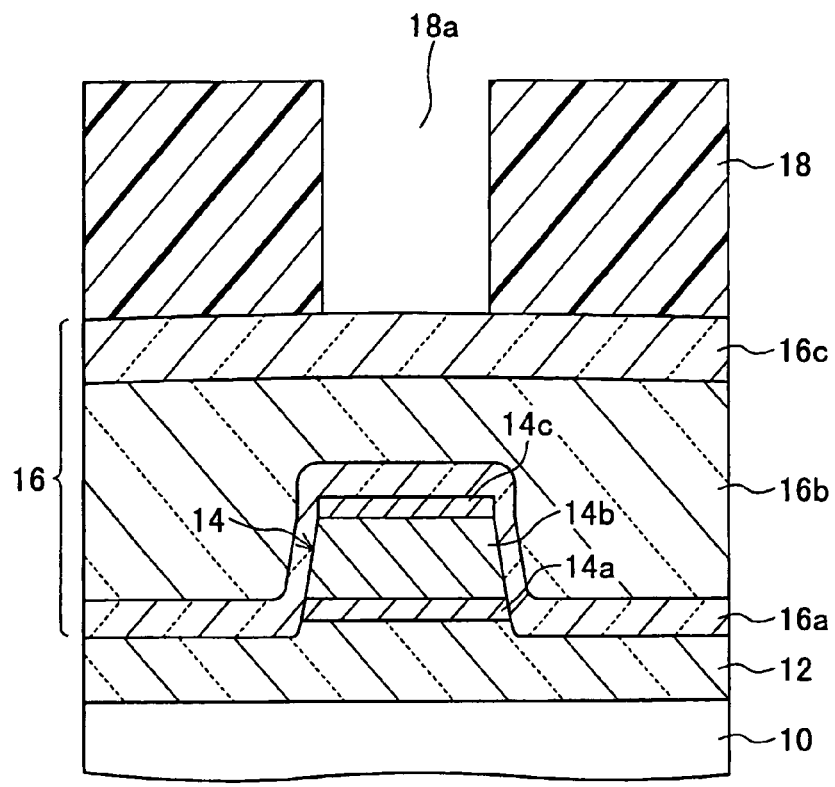
FIG. 2 is a cross sectional view illustrating a resist layer forming process following the process shown in FIG. 1.
Figure 3:
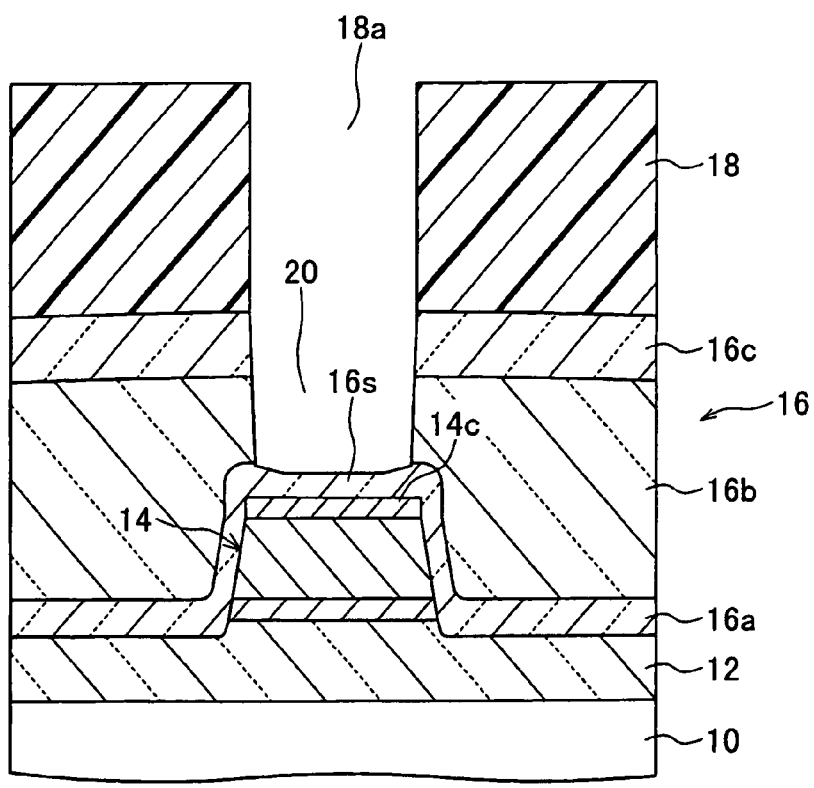
FIG. 3 is a cross sectional view illustrating a first dry etching process following the process shown in FIG. 2.

(3) A contact hole 20 is formed through the lamination layer of the coated insulating film 16b and deposited insulating film 16c to leave a portion of the deposited insulating film 16a on the bottom of the contact hole 20. This dry etching is performed by using fluorocarbon-containing gas as etching gas, under a highly depositive condition. For example, the dry etching conditions may be:

Gas flow: $CF_4/CHF_3$=20 to 50/80 to 100 sccm, (preferably 30/90 sccm)
RF power: 750 W
Pressure: 200 mTorr Since the dry etching process shown in FIG. 3 is executed under the highly depositive condition, it is possible to suppress the coated insulating film 16b from being side-etched and retracted (having the bowing shape) on the side wall of the contact hole 20. The polymer described with reference to FIG. 6 is formed by etching conductive material such as the antireflection film 14c. The dry etching process shown in FIG. 3 etches an upper part of the interlayer insulating film 16, leaving the deposited insulating film 16a, so that polymer generation can be suppressed.

Figure 4:
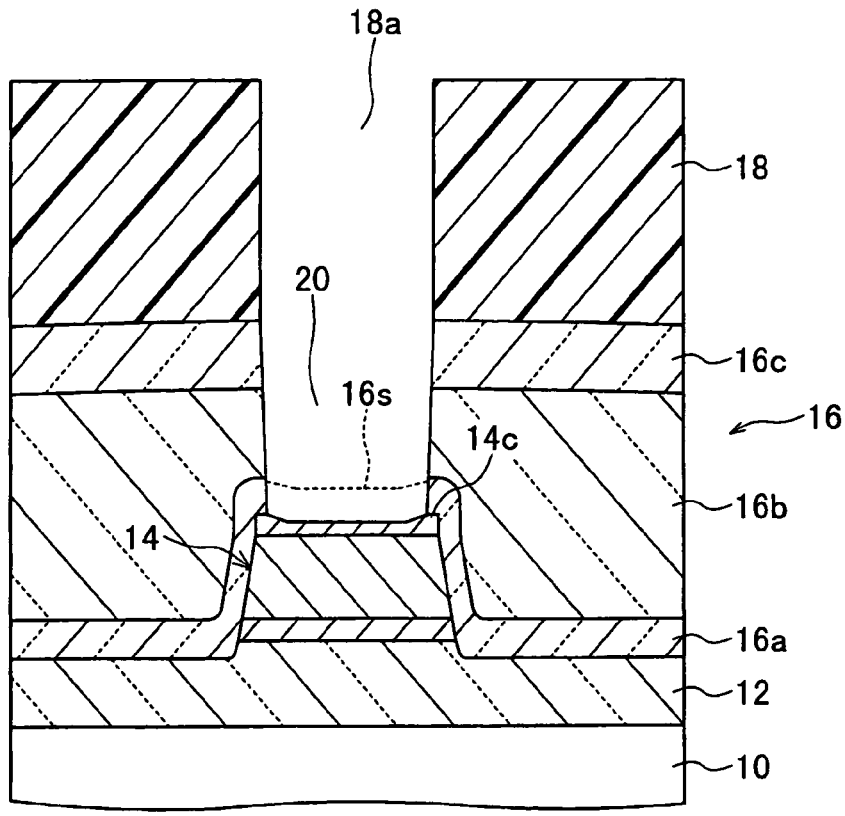
FIG. 4 is a cross sectional view illustrating a second dry etching process following the process shown in FIG. 3.
Figure 5:
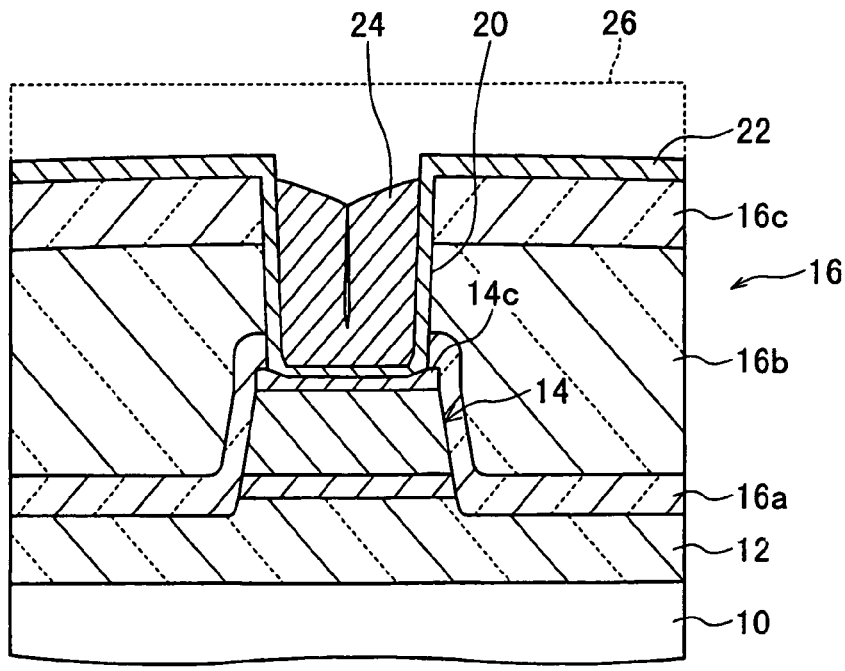
FIG. 5 is a cross sectional view illustrating a W plug forming process following the process shown in FIG. 4.

(4) The portion 16s of the deposited insulating film 16a exposed at the bottom of the etched hole is removed by dry etching using the resist layer 18 as a mask, to make the contact hole 20 reach the antireflection film (uppermost film) 14c of the wiring layer 14. This dry etching is performed using fluorocarbon-containing gas as etching gas, under a lowly depositive condition. For example, the dry etching conditions may be:

Gas flow: $CF_4/CHF_3/N_2$=20 to 50/80 to 100/3 to 10 sccm, (preferably 30/90/4 to 5 sccm)
RF power: 750 W
Pressure: 200 mTorr Even if the dry etching process shown in FIG. 4 is executed in the lowly depositive condition, the coated insulating film 16b is hardly side-etched on the side wall of the contact hole 20 because of a short etching time. The deposited insulating film 16a is hardly side-etched under the lowly depositive condition because of its essential nature.

As compared to the dry etching process shown in FIG. 3, different point of the dry etching process shown in FIG. 4 is only the addition of $N_2$ to the etching gas. Therefore, the dry etching process shown in FIG. 4 may be executed continuously with the dry etching process shown in FIG. 3, by starting supply of $N_2$ gas in the process of FIG. 3. Alternatively, if a dry etcher of a multi-chamber type is used, the process may be executed by transferring the substrate 10 from a $N_2$ non-added etching chamber to a $N_2$ added etching chamber without exposing the substrate 10 to the atmospheric air. In either case, the process can be executed rapidly without exposing the substrate 10 and interlayer insulating film 16 to the atmospheric air (preventing contamination).

After the dry etching process shown in FIG. 4, over etching is performed if necessary. The over-etching conditions may be the same as those described with FIG. 4. Thereafter, the resist layer 18 is removed by ashing or the like and etching residues (byproducts) are removed by a chemicals process or the like. In the dry etching processes shown in FIGS. 3 and 4, since generation and adhesion of polymer described above are suppressed, the residue removal process is not necessary which uses strong solution of chemicals giving damages to the coated insulating film 16b.

According to the two-step dry etching process described with reference to FIGS. 3 and 4, it is possible to form the contact hole 20 not having the bowing shape and polymer adhesion, as shown in FIG. 4. The following Table 1 shows how polymer adhesion suppression effect and side-etch suppression effect change with $N_2$ flow rate.

|  | Comparative Examples |  |  |  |  | Embodiment |
|---|---|---|---|---|---|---|
| $N_2$ Flow Rate (sccm) | 0 | 1 | 3 | 5 | 7 | 10 | 0 → 5 |
| Polymer Adhesion Suppression | x | Δ | o | o | o | o | o |
| Side-etch Sppression | o | x | x | x | x | x | o |

In "comparative examples" in Table 1, a $N_2$ flow rate of 0 sccm corresponds to the dry etching process described with reference to FIG. 6, and a $N_2$ flow rate of 1 to 10 sccm corresponds to the dry etching process described with reference to FIG. 8. At a $N_2$ flow rate of 0 sccm, polymer adhesion cannot be suppressed (polymer is adhered strongly), at a $N_2$ flow rate of 1 sccm, polymer adhesion appears slightly, and at a $N_2$ flow rate of ≧3 a polymer adhesion suppression effect is good. Although a side-etch suppression effect is good at a $N_2$ flow rate of 0 sccm, the side-etch suppression effect is lost if $N_2$ is added even at 1 sccm (at a $N_2$ flow rate≧1). A retraction amount of the coated insulating film by side etching was almost independent from the $N_2$ flow rate.

It can be seen from Table 1 that it is difficult for the one-step dry etching process described with reference to FIG. 6 or 8 to obtain both the polymer adhesion suppression effect and the side-etch suppression effect. In contrast, according to "embodiment" at a $N_2$ flow rate of 0 sccm in the process shown in FIG. 3 and a $N_2$ flow rate of 5 sccm in the process shown in FIG. 4, it can be seen that both the polymer adhesion suppression effect and the side-etch suppression effect are good.

(5) An adhesion layer 22 is formed on the interlayer insulating film 16, covering the inner surface of the contact hole 20. The adhesion layer 22 is formed of a lamination film, constituted of a TiN film of 50 to 250 nm in thickness (preferably 100 nm) stacked on a Ti film of 10 to 50 nm (preferably 20 nm). In this case, a TiON film may be formed in place of the TiN film and stacked on the TiN film. After a tungsten (W) layer is deposited on the substrate upper surface, the unnecessary W layer is etched back to leave a W plug 24 made of W in the contact hole 20. Thereafter, a wiring material layer 26 is deposited on the substrate upper surface, and an upper wiring layer connected with the adhesion layer 22 and W plug 24 is formed by patterning or the like of a lamination layer of the metal layer 26 and adhesion layer 22.

According to the embodiment described above, the contact hole 20 having a good shape and no polymer adhesion can be obtained. Therefore, adhesion of the adhesion layer 22 to the side wall of the contact hole 20 and the contact state of the adhesion layer 22 to the wiring layer 14 are good, and a buried shape of the W plug 24 is good. It is therefore possible to improve stability and reliability in an interlayer interconnect portion and reduce a contact resistance.

The present invention has been described in connection with the preferred embodiments. The invention is not limited only to the above embodiments. It will be apparent to those skilled in the art that other various modifications, improvements, combinations, and the like can be made.

What are claimed are:

1. A method for manufacturing a semiconductor device, the method comprising:

forming a wiring layer on an insulating film covering a principal surface of a semiconductor substrate, wherein said wiring layer comprises an antireflection film formed as an uppermost layer of said wiring layer;

forming an interlayer insulating film on said insulating film, said interlayer insulating film covering said wiring layer and including a lamination film of a deposited insulating film and a coated insulating film stacked in a recited order from a bottom; and forming a contact hole through said interlayer insulating film in a region corresponding to a partial surface area of said wiring layer, by a selective dry etching process, said selective dry etching process being executed by a plurality of steps including at least first and second steps, said first step etching said insulating film to leave at least a portion of said deposited insulating film and not expose said antireflection film of said wiring layer under a highly depositive condition such that said coated insulating film is not side-etched, and said second step etching said deposited insulating film under a lowly depositive condition such that polymer formation derived from said wiring layer is suppressed in said contact hole.

2. The method for manufacturing a semiconductor device according to claim 1, wherein said selective dry etching process executes etching of said second step after etching of said first step, without exposing said interlayer insulating film to an atmospheric air.

3. The method for manufacturing a semiconductor device according to claim 1, wherein etching of said first step uses fluorocarbon gas not containing nitrogen, and etching of said second step uses fluorocarbon gas containing nitrogen.

4. The method for manufacturing a semiconductor device according to claim 3, wherein said step of forming said wiring layer forms a wiring layer having a conductive layer containing titanium-containing compound as an uppermost layer.

5. The method for manufacturing a semiconductor device according to claim 4, wherein said step of forming said interlayer insulating film forms an inorganic spin-on-glass film or an organic spin-on-glass film as said coated insulating film.

6. The method of manufacturing a semiconductor device according to claim 1, further comprising the steps of forming a MOS transistor on the semiconductor substrate, and forming the insulating film covering the MOS transistor.

\* \* \* \* \*